United States Patent [19]
Verding et al.

[11] Patent Number: 5,671,126
[45] Date of Patent: Sep. 23, 1997

[54] HOUSING FOR THE ACCEPTANCE OF EQUIPPED PRINTED CIRCUIT BOARDS

[75] Inventors: Markus Verding, Dorsten; Thomas Ehm, Dortmund, both of Germany

[73] Assignee: Siemens Aktiengesellschaft, Munich, Germany

[21] Appl. No.: 393,828

[22] Filed: Feb. 24, 1995

[30] Foreign Application Priority Data

Feb. 25, 1994 [DE] Germany .............................. 9403212 U

[51] Int. Cl.$^6$ ..................................................... H05K 7/14
[52] U.S. Cl. ........................... 361/796; 361/736; 361/790; 361/741; 361/756; 361/752; 361/802; 439/377
[58] Field of Search ......................................... 361/683, 685, 361/686, 796, 724, 736, 730, 740, 790, 725, 741, 756, 785, 684, 752, 802; 439/59, 61, 377, 629, 636

[56] References Cited

U.S. PATENT DOCUMENTS 5,552,965  9/1996  Habegger ............................ 361/801

FOREIGN PATENT DOCUMENTS 3402644  1/1984  Germany .

*Primary Examiner*—Leo P. Picard
*Assistant Examiner*—Phuong T. Vu
*Attorney, Agent, or Firm*—Hill, Steadman & Simpson

[57] ABSTRACT

A first printed circuit board (principal printed circuit board) is placed onto a housing frame having a stepped contour in a front edge region of the housing. The first printed circuit board is introduced into a receptacle of the frame provided with an entry bevel and, when put in place, is automatically interlocked by interlocked elements preferably arranged at an opposite side. Additional printed circuit boards can be inserted into guide elements present at the backplane, being inserted under this first printed circuit board. Their ultimate position is compelled by corresponding holder elements. In this ultimate position, each printed circuit board that is introduced and lies parallel to the backplane is interlocked by an interlock element that takes effect in this position. The additional, second printed circuit boards can be inserted independently of the first printed circuit board and are preferably provided for optional add-ons.

12 Claims, 3 Drawing Sheets

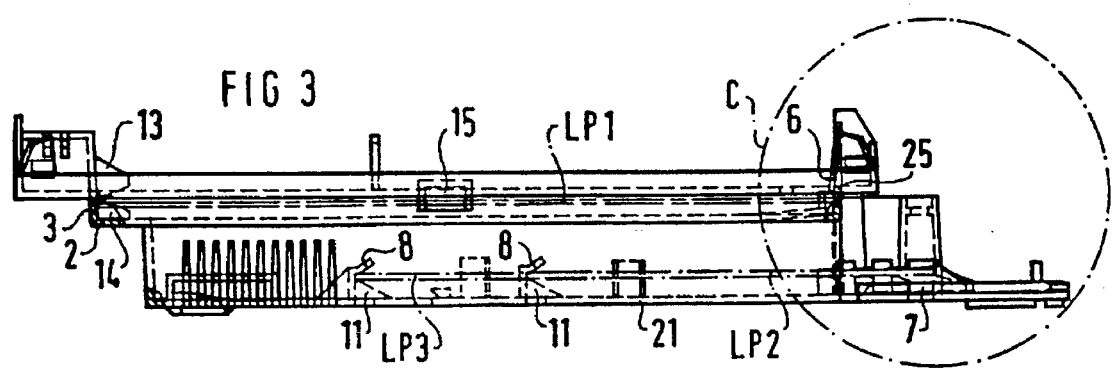
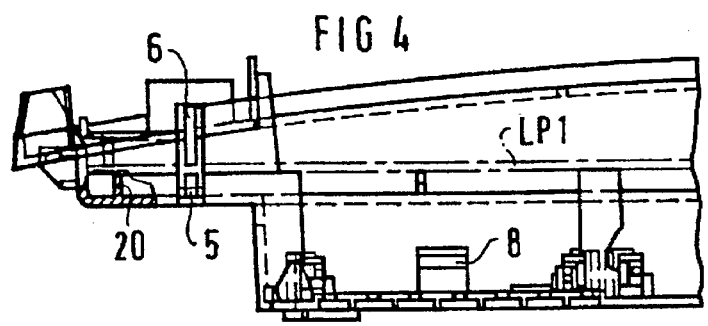
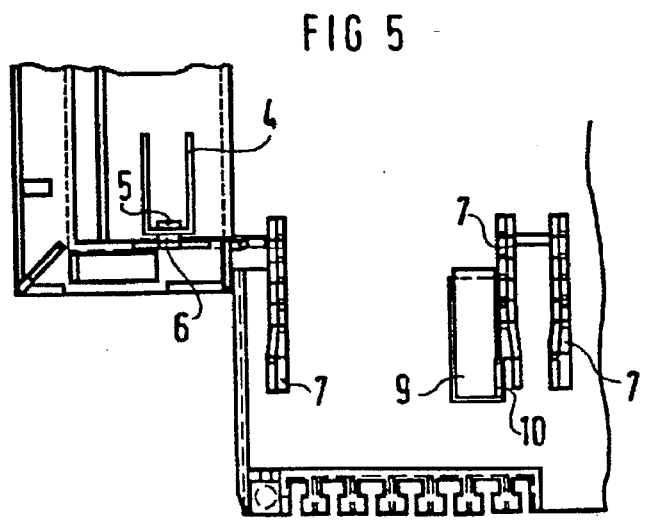

HOUSING FOR THE ACCEPTANCE OF EQUIPPED PRINTED CIRCUIT BOARDS

BACKGROUND

The present invention is directed to a housing for the acceptance of equipped printed circuit boards having open area accessible from the front which can be covered with a cover hood. Particularly, the present invention is directed to such a housing for the acceptance of printed circuit boards whose equipping forms at least parts of a communication system, whereby a plurality of printed circuit boards are insertable into the housing parallel to one another.

In a housing that is configured to accept a plurality of printed circuit boards, it is conventional to insert the printed circuit boards erect side-by-side into corresponding guide grooves. The printed circuit boards are provided with plug devices for the connection of leads and for electrical connection to one another, these plug devices being arranged at what is the front edge in insertion direction and contacting cooperating plugs present at the backplane. Such an arrangement for the acceptance of printed circuit boards in a housing is meaningful when the printed circuit boards are approximately the same size and the housing represents a larger unit in and of itself. The connector parts of the printed circuit boards are consequently located inside of the housing so that cooperating plug units are arranged to allow possible partial equipping. Particularly in those instances wherein functional additions or optional circuit cards are to be installed, it is also known to additionally plug printed circuit boards correspondingly adapted in size onto a principal printed circuit board via plug-type connectors. This also assumes a correspondingly large housing.

SUMMARY OF THE INVENTION

An object of the present invention is to enable a flexible, purpose-orientated arrangement of equipped printed circuit boards in a housing. This is achieved in that a first printed circuit board can be placed onto a seating surface distanced from the backplane with supporting parts connected to the backplane. The first printed circuit board can be secured in this condition approximately parallel to the backplane position. At least one second printed circuit board is insertable with free accessibility in a space between the first printed circuit board and the backplane, being inserted into corresponding holder and guide elements that are integrally connected to the backplane and attached in the region of the printed circuit board edge.

The printed circuit boards are thus seated and held in different ways in two planes. Printed circuit boards of different sizes can be introduced. Given an appropriate arrangement of the holder and guide elements at the backplane, a plurality of printed circuit boards can be inserted side-by-side. These printed circuit boards installed as initial equipment or subsequently inserted to provide optional predetermined functions. Depending on their dimensions, each printed circuit board is guided into an ultimate position by guide and holder elements during insertion. The insertion of printed circuit boards at the backplane can also ensue unproblematically with the first printed circuit board continuing to rest thereagainst. Thus, the cover hood which also covers this printed circuit board need not be removed for this purpose. Such an arrangement of printed circuit boards having different fastening modes offer advantages for service and a greater design freedom for the housing thereby simultaneously derives. For example, it is possible to create a monitor-like character for the housing in those instances wherein the area for the first printed circuit board to be put in place is larger than the area into which the at least second printed circuit board is to be inserted. For example, this can ensue on the basis of an appropriate undercut.

In an embodiment of the present invention, pans of plug-type connectors necessary both for the external connections as well as for the electrical connection of the individual printed circuit boards to one another are arranged at the back edge region in insertion direction of an at least one additional insertable printed circuit board and at the edge region of the first printed circuit board put in place and adjacent thereto. Given a cabinet housing or given a housing used as wall housing in the use position, access to the terminal regions can thus ensue in a simple way. Desired modifications can thus be unproblematically implemented as needed.

According to a an embodiment of the invention, the supporting parts—except their side accessible for the insertion of the at one additional, lower printed circuit board—are fashioned as a frame that simultaneously co-forms the corresponding sidewalls of the housing. This frame can thus comprise an edge region fashioned step-like, so that a limit for the first printed circuit board is simultaneously established. As a result of the selected contour of the frame, an edge region—a lower edge region given a housing employed as wall housing—at which the terminal elements are arranged is freely accessible as a result of the invention.

According to an embodiment of the invention, the first printed circuit board to be inserted is held in a receptacle for the board edge or, respectively, for the edge of one side of this printed circuit board, formed at an edge region of the frame. An interlock element is provided for reliably securing or holding automatically attaches in an interlocking fashion at the board edge at least one side of this printed circuit board is has been put in place. In a simple way, the interlock element is composed of a resilient web which is deflected when the first printed circuit board is put in place. The resilient web overlaps the board edge in interlocking fashion and returns into its initial position after the printed circuit board has been put in place. The resilient web is cut free from a wall part residing perpendicularly relative to the plane of the printed circuit board, preferably in the corner region of the board edge lying opposite the receptacles. The web also has its free end directed in the direction of the frame wall serving as seat for the first printed circuit board in conformity with its stated purpose.

A partial guide channel is provided into which the board edge of the first-installed printed circuit. The partial guide channel is formed by a plurality of noses attached to the frame reside approximately perpendicularly to the board plane. Each nose has an incision toward its free end which has an entry bevel for the introduction of the edge region of the printed circuit board.

To allow unproblematic removal of an installed printed circuit board, particularly given a wall housing, a counterspring engages from below against the emplaced printed circuit board in the region of the interlock location. The spring provides a lift-off motion of the printed circuit board. After an unlocking has been undertaken, consequently, the printed circuit board moves outward.

According to a further embodiment of the invention, guide elements for the lower additional printed circuit board are fashioned directly at the backplane panel. When the defined ultimate position has been reached, the respective printed circuit board is secured with an interlock element.

This interlock element can include a resilient web cut free from the backplane panel having a nose attached to its free end. It is initially deflected when the lower printed circuit board is inserted and, in the ultimate position of the printed circuit board, the printed circuit board is fixed in secured fashion with it when it returns into its initial position.

Additional features and advantages of the present invention are described in, and will be apparent from, the detailed description of the presently preferred embodiments and from the drawings.

BRIEF DESCRIPTION OF THE DRAWINGS

The invention shah be set forth in greater detail below with reference to an exemplary embodiment.

FIG. 3 illustrates a side view of the housing of FIG. 1.

FIG. 4 illustrates an enlarged view of the sector A of FIG. 2.

FIG. 5 illustrates an enlarged view of the sector B of FIG. 1.

DETAILED DESCRIPTION OF THE PRESENT PREFERRED EMBODIMENTS

Figure 1:
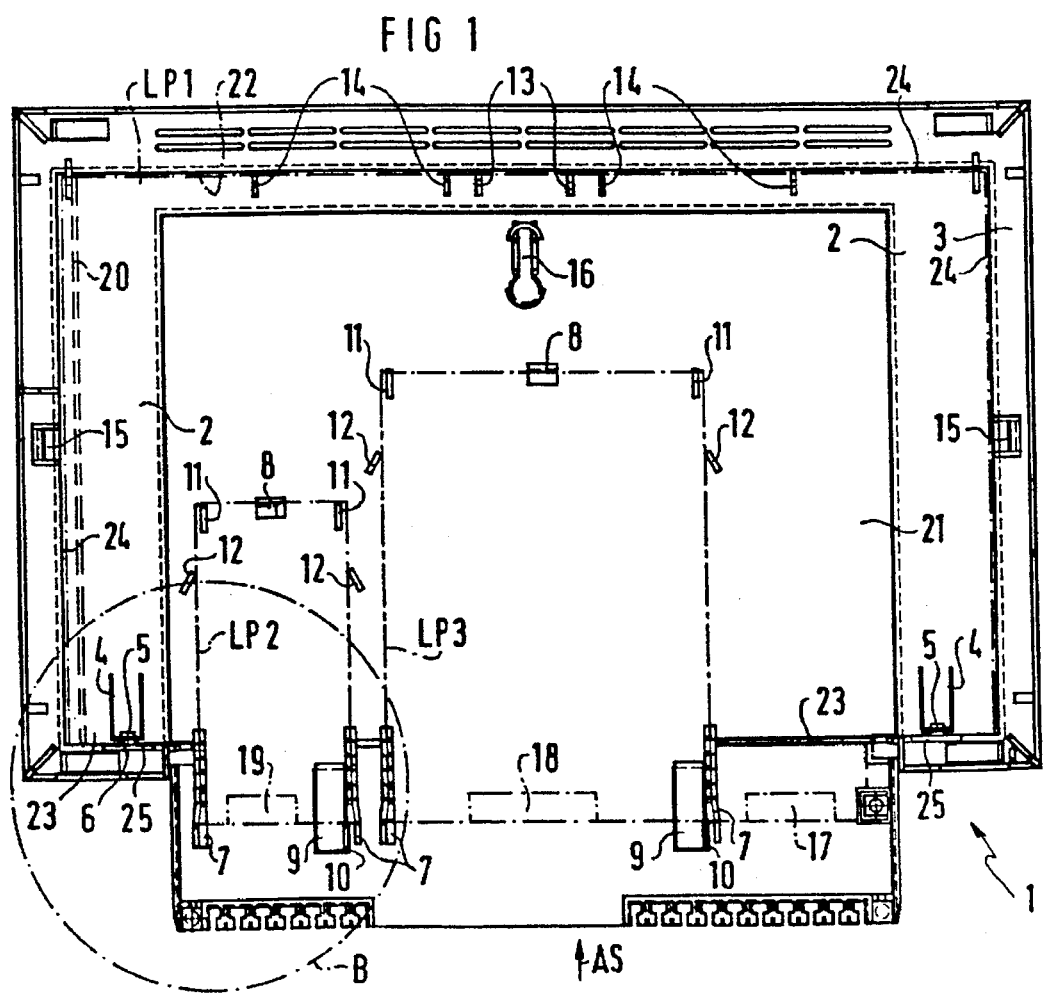
FIG. 1 illustrates a plan view of a housing with the cover hood removed.

FIG. 1 shows a plan view of a housing 1 which can be secured to a wall by an oblong hole 16 with a corresponding hanger device (not shown). Multiple printed circuit boards LP1–LP3 schematically indicated by dot-dashed lines can be arranged in the housing 1. The housing 1, for example, can receive primed circuit boards as components of a communication system. In such an embodiment, the housing 1 is provided for a communication system that, naturally, will comprise only a small plurality of communication terminals.

Figure 2:
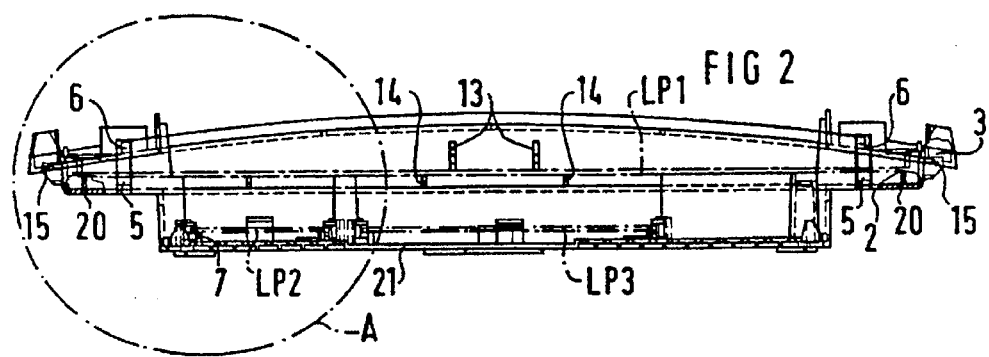
FIG. 2 illustrates a partially cut bottom view of the housing of FIG. 1.

As may be derived from FIGS. 1 and 2, the housing-with the exception of the terminal side AS—comprises a frame-like edge region including an internally stepped frame contour 2, 3, providing both a seating surface 2 for a first printed circuit board LP1 as well as a corresponding limitation for this primed circuit board in terms of shape. The printed circuit board LP1 can be a main primed circuit board which, for example, carries all or only the most critical components of a communication system. The primed circuit board LP1 is inserted into or, respectively, placed onto this frame present at three limiting sides. To this end, a receptacle for an edge 22 of the printed circuit board LP1 is provided at an upper edge region of the frame. This receptacle is composed of a plurality of shoulders 13, 14 arranged over the width of this frame, each having a free end shaped as an entry bevel. Furthermore, each shoulder 13, 14 has limiting edges facing toward one another, which approximately correspond to the thickness dimension of the printed circuit board LP1, and is received therebetween with minimal spacing. The shoulders 13 are attached to a wall sub-surface 24 of the frame-like contour 2, 3 residing perpendicularly relative to the seating surface 2, whereas the shoulders 14 spaced laterally therefrom are present at the upper frame surface.

In order to introduce the printed circuit board LP1 into the housing, the upper printed circuit board edge 22 is first inserted on the opening formed by the entry bevel into said shoulders, being inserted up to the rear detent and being moved toward the frame surface until it rests thereagainst. It is not necessary that the printed circuit board lie directly on the seating surface 2, but can be spaced therefrom. For providing such spacing, a web 20 proceeding parallel to the sidewall surface 24 can be provided. The printed circuit board LP1 can thus be equipped in a region overlapping the sub-area 2.

Given a downward motion required for seating the printed circuit board LP1, a resilient web 6 is cut from a wall part 25 residing perpendicularly relative to the frame surface 2, the web 6 being first pressed away by the edge of the printed circuit board LP1. After the printed circuit board has been put in place onto the frame surface 2, the web 6 overlaps the edge of the primed circuit board as a result of springing back into its original position. As may be derived from FIGS. 1–3, this ensues at the two corner regions of the housing or, respectively, of the frame contour. The printed circuit board LP1 that has been put in place is thus automatically interlocked by the resilient web 6 that serves as interlock spring. The printed circuit board 1 is arranged erect in the wall housing 1 and is thus prevented from moving toward the front.

Figure 6:
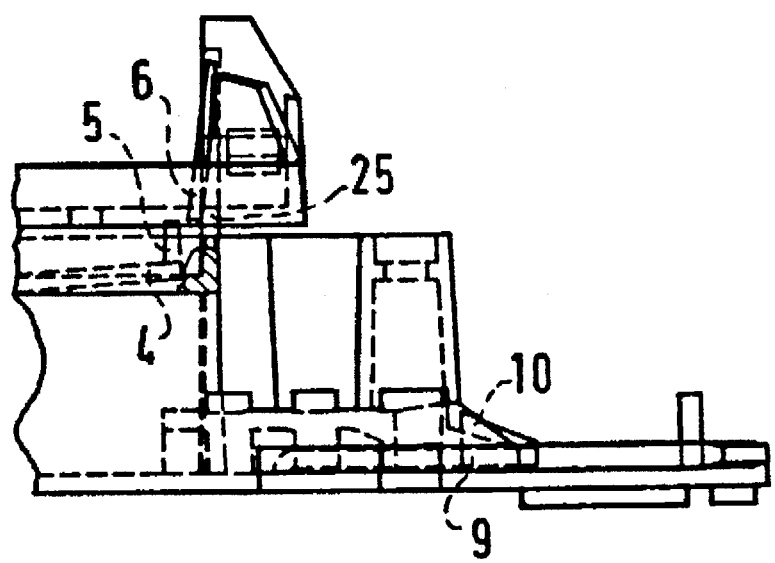
FIG. 6 illustrates an enlarged view of the sector C of FIG. 3.
Figure 7:
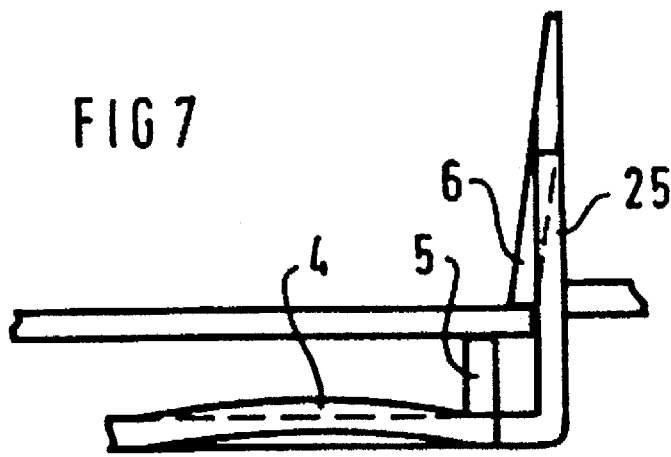
FIG. 7 illustrates an enlarged illustration of the interlock location.

As may be derived from FIG. 1-3 and, in particular, from the enlarged illustration of the sector C according to FIG. 6, a resilient spring 4 is located in the immediate proximity of the resilient web 6 in the sub-surface 2 of the frame-like contour. This spring, formed by slits in the sub-surface 2, has a shoulder 5 that proceeds at a right angle relative to the longitudinal axis thereof and is directed onto the printed circuit board. The spring 4 that is pre-stressed when the printed circuit board LP1 is put in place biases and contacts against the printed circuit board LP1 at this shoulder 5. As already set forth, this printed circuit board LP1 is interlocked in the inserted condition by the spring 6, since the latter overlaps the edge of the printed circuit board LP1 after it has been deflected and returned into its inial position. This is shown in the excerpt shown in FIG. 7. After unlocking the printed circuit board LP1 by pressing the interlock spring 6 down, the printed circuit board LP1 is moved forward by the spring 4. It can thus be unproblematically lifted off. The arrangement of the counter-spring 4 in the corner region of the seating surface formed by the frame-like contour may also be derived from FIG. 5.

So that the printed circuit board LP1 can be fully utilized for interconnects and equipping elements over nearly its entire surface, the printed circuit board preferably does not rest directly on the housing step formed by the sub-surface 2; rather, a web 20 residing perpendicularly relative to this surface is present to space the printed circuit board LP1 from the surface 2. Such a web 20, which can also be replaced by individual support elements having the same height, is necessary given the employment of the shoulder 14 provided for the acceptance of the edge of the printed circuit board. The maximum heights of these shoulders 14 and of the web 20 coincide. The upper and the respective lateral limitation for the printed circuit board to be put in place is formed by the wall part 24 of the frame-like contour that proceeds parallel to the web or, respectively, perpendicularly relative to the seating surface 2.

As illustrated in FIGS. 2 and 3, the housing has backplane 21 which is recessed away from the seating surface 2. When the housing 1 is mounted to a wall, this backplane 21 rests generally flatly against the wall. As may be particularly derived from FIG. 1 and from FIG. 2 as well, a part of the backplane 21 forming the actual wall-seating surface of the housing 1 is not as wide as the region that accepts the printed circuit board LP1. As a design principle, such a fundamentally z-shaped fashioning of the edge regions (with the exception of the terminal side AS) yields a monitor-like character for this housing.

According to the present invention, at least one additional printed circuit board LP2 and/or LP3, can be inserted next to this principal printed circuit board LP1 without removing the printed circuit board LP1. In the exemplary embodiment, two more printed circuit boards, namely the printed circuit board LP2 and the printed circuit board LP3, are independently insertable. The inserted printed circuit boards LP2 and LP3 are respectively indicated in FIGS. 1–4 by dot-dashed lines.

Guide elements 7 are provided on the recessed backplane 21 into which the respective additional printed circuit boards, for example LP2, can be inserted proximally parallel to the backplane even when the printed circuit board LP1 is installed. In an embodiment where the housing is made of injection molded plastic, these guide elements 7 are directly joined to the backplane 21 of the housing 1 and are of one piece therewith. A guide channel that enables the targeted insertion of the printed circuit boards LP2 and LP3 is formed in each guide element 7 to receive a respective lateral edge of the respective printed circuit board. As may be derived from FIG. 1, the guide elements 7 extend only partially to the length of the printed circuit boards LP2 and LP3. During insertion of each printed circuit board LP2 and LP3, additional guidance is provided by the webs 12 at both sides. The ultimate position is defined by the peg 8 extending from the backplane 21, as seen from FIG. 3. As illustrated, the peg 8 can be shaped to guide downward and hold an inserted printed circuit board.

Shoulders 11 spaced approximately at the width of each respective printed circuit board LP2 and LP3 form an entry bevel for the printed circuit board to be inserted, for example the printed circuit board LP2, as may be seen from FIG. 3. The pegs 8 and shoulders 8 thus guide the printed circuit board into a compulsory ultimate position. Interlock springs 9, as illustrated in FIGS. 1, 5 and 6, are present for securing the position of each inserted printed circuit board LP2 and LP3. This interlock springs 9 are each composed of a resilient web defined by slits in the backplane panel 21. In the unstressed position, each spring 9 projects somewhat forward from the backplane level and is deflected toward the back as a consequence of a nose 10 arranged at its end. When the printed circuit board has been fully inserted, the respective web or spring 9 returns into the quiescent position. The inserted printed circuit board is thus positionally secured by the nose 10 of the resilient spring 9 which locks over the edge of the printed circuit board.

It is fundamentally possible to not only insert printed circuit boards LP2 and LP3 in the side-by-side relationship shown, but it is also possible to introduce further printed circuit boards (not shown) above the printed circuit boards LP2 and LP3 in a stacked parallel manner in the same way described above given appropriately fashioned guide and interlock elements. In the exemplary embodiment, only two printed circuit boards LP2 and LP3 are seated side-by-side at the backplane 21 in the described way. The printed circuit boards LP2 and LP3 to be inserted at least in a second plane can, as a result of their equipping, be utilized for fundamental functions of the function unit that the housing 1 accepts, being utilized for this purpose in the same way as the printed circuit board LP1 that has been inserted or, respectively, emplaced. Given, for example, a communication system, however, they can also be allocated to functions that are optionally provided for the system.

The frame structure of the housing 1 is interrupted at the terminal side AS. The lower printed circuit board edge region of the introduced printed circuit boards given a wall housing are thus freely accessible. Plug elements indicated by the plug elements 17–19 can be attached at these edge regions. The individual printed circuit boards can be connected to one another by the corresponding plug-type connectors or individual feeders or, respectively, leads can be thereby connected.

The housing can be closed with a cover hood 30. To this end, this hood 30 can have resilient catch hooks that are introduced into recesses 15 of the respectively lateral housing edge when the cover hood is joined to the housing part 1. They thereby engage into a cooperating latch. This can ensue, for example, in that the catch hook that is initially deflected snaps in behind the housing wall upon return into its initial position in the outer edge region. After the cover hood 30 has been unlocked and lifted off, the terminal elements at the lower printed circuit board edge are unproblematically accessible.

It should be understood that various changes and modifications to the presently preferred embodiments will be apparent to those skilled in the art. Such changes and modifications can be made without departing from the spirit and scope of the present invention. It is, therefore, intended that such changes and modifications be covered by the appended claims.

What is claimed is:

1. A housing for receiving and holding a plurality of printed circuit boards in a parallel manner, said housing comprising:

an opening accessible from a front side;

an internal frame including a seat distanced from a backplane, said seat being configured to receive and support a first printed circuit board to hold the first printed circuit board approximately parallel to the backplane;

a space between the seat which supports the first printed circuit board and the backplane, into which at least one second printed circuit board is insertable and accessible, each said at least one second printed circuit board being insertable into holder and guide elements that extend from the backplane and engage a lateral edge of each respective at least one second printed circuit board;

wherein the housing generally forms a frame including the seat to support the first printed circuit board along edges of said first printed circuit board and providing clearance for insertion of said at least one second printed circuit board, and wherein the frame is generally stepped in shape and is generally the dimensions of the first printed circuit board so that the frame cooperatively receives and limits the position of the first printed circuit board.

2. The housing according to claim 1 wherein said housing is mountable on a wall.

3. The housing according to claim 1, wherein said interlocking holder elements for each at least one second printed circuit board seated at the backplane panel are positioned such that they respectively engage a lower edge of the said at least one respective printed circuit board; and wherein at least one interlocking holder element is provided to engage and secure a lower edge of the first printed circuit board.

4. The housing according to claim 1 wherein said housing, including the backplane, holder, and guide elements is a one-piece injection molded plastic part.

5. A housing for receiving and holding a plurality of printed circuit boards in a parallel manner, said housing comprising:

an opening accessible from a front side;

an internal frame including a seat distanced from a backplane, said seat being configured to receive and support a first printed circuit board to hold the first printed circuit board approximately parallel to the backplane;

a space between the seat which supports the first printed circuit board and the backplane, into which at least one second printed circuit board is insertable and accessible, each said at least one second printed circuit board being insertable into holder and guide elements that extend from the backplane and engage a lateral edge of each respective at least one second printed circuit board; and at least one web on the seat to support said first printed circuit board thereon in a spaced relation from a surface of said seat;

wherein the housing generally forms a frame including the seat to support the first printed circuit board along edges of said first printed circuit board and providing clearance for insertion of said at least one second printed circuit board.

6. A housing for receiving and holding a plurality of printed circuit boards in a parallel manner, said housing comprising:

an opening accessible from a front side;

an internal frame including a seat distanced from a backplane, said seat being configured to receive and support a first printed circuit board to hold the first printed circuit board approximately parallel to the backplane;

a space between the seat which supports the first printed circuit board and the backplane, into which at least one second printed circuit board is insertable and accessible, each said at least one second printed circuit board being insertable into holder and guide elements that extend from the backplane and engage a lateral edge of each respective at least one second printed circuit board;

at least one web on the seat to support said first printed circuit board thereon in a spaced relation from a surface of said seat;

a receptacle for an edge of the first printed circuit board formed at an edge region of the flame;

at least one interlock element automatically engaging an edge of the first printed circuit board in interlocking fashion when said first printed circuit board is fully inserted; and a plurality of noses extending from the frame generally perpendicularly to the first printed circuit board, each said nose having an incision toward a free end provided with an entry bevel to introduce an edge of the printed circuit board;

wherein the housing generally forms a frame including the seat to support the first printed circuit board along edges of said first printed circuit board and providing clearance for insertion of said at least one second printed circuit boards.

7. A housing for receiving and holding a plurality of printed circuit boards in a parallel manner, said housing comprising:

an opening accessible from a front side;

an internal frame including a seat distanced from a backplane, said seat being configured to receive and support a first printed circuit board to hold the first printed circuit board approximately parallel to the backplane;

a space between the seat which supports the first printed circuit board and the backplane, into which at least one second printed circuit board is insertable and accessible, each said at least one second printed circuit board being insertable into holder and guide elements that extend from the backplane and engage a lateral edge of each respective at least one second printed circuit board;

a receptacle for an edge of the first printed circuit board formed at an edge region of the frame;

at least one interlock element automatically engaging an edge of the first printed circuit board in interlocking fashion when said first printed circuit board is fully inserted; and a resilient web deflected when the first printed circuit board is inserted and which resiliently engages an edge of the first printed circuit board in interlocking fashion, returning into its initial position after the emplacement of the first printed circuit board;

wherein the housing generally forms a frame including the seat to support the first printed circuit board along edges of said first printed circuit board and providing clearance for insertion of said at least one second primed circuit board.

8. The housing according to claim 7, wherein the resilient web is formed by slits in a wall of the housing which resides perpendicularly relative to a plane of the printed circuit board, the web having a free end directed generally toward the seat for supporting the first printed circuit board.

9. A housing for receiving and holding a plurality of printed circuit boards in a parallel manner, said housing comprising:

an opening accessible from a front side;

an internal frame including a seat distanced from a backplane, said seat being configured to receive and support a first printed circuit board to hold the first printed circuit board approximately parallel to the backplane;

a space between the seat which supports the first printed circuit board and the backplane, into which at least one second printed circuit board is insertable and accessible, each said at least one second printed circuit board being insertable into holder and guide elements that extend from the backplane and engage a lateral edge of each respective at least one second printed circuit board;

a receptacle for an edge of the first printed circuit board formed at an edge region of the frame; and at least one interlock element automatically engaging an edge of the first printed circuit board in interlocking fashion when said first printed circuit board is fully inserted;

wherein the housing generally forms a frame including the seat to support the first printed circuit board along edges of said first printed circuit board and providing clearance for insertion of said at least one second printed circuit board, and wherein a counter-spring engages the emplaced first printed circuit board proximal to the interlocking engagement, said counter-spring providing a lift-off motion when said web is disengaged.

10. The housing according to claim 9, wherein the counter-spring is a resilient web formed by slits in the frame, said counterspring, in its deflected condition, exerting a pressing power onto the first printed circuit board with a shoulder disposed at a free end thereof, the shoulder extending approximately at a right angle relative to its longitudinal axis and directed onto the first printed circuit board.

11. A housing for receiving and holding a plurality of printed circuit boards in a parallel manner, said housing comprising:

an opening accessible from a front side;

an internal frame including a seat distanced from a backplane, said seat being configured to receive and support a first printed circuit board to hold the first printed circuit board approximately parallel to the backplane;

a space between the seat which supports the first printed circuit board and the backplane, into which at least one second printed circuit board is insertable and accessible, each said at least one second printed circuit board being insertable into holder and guide elements that extend from the backplane and engage a lateral edge of each respective at least one second printed circuit board;

wherein the holder and guide elements for each second printed circuit board are formed by webs extending from the backplane panel, at least some of the guide elements forming a slot-like receptacle for respective edge regions of each at least one second printed circuit board that proceeds insertion direction, said guide and guide elements including at least one guide peg for each at least one second printed circuit board to provide a detent which defines an ultimate position of the respective at least one second printed circuit board; and wherein each holder element guide and is an interlock element to secure each at least one second printed circuit board in a fully inserted position.

12. The housing according to claim 11, wherein each interlock element comprises:

a resilient web formed by slits in the backplane panel, the web being deflected during insertion of the respective second printed circuit board and engaging an edge thereof when that printed circuit board is in its ultimate position, the web returning into its initial position.

* * * * *